(12) United States Patent
Varga et al.

(10) Patent No.: US 11,373,985 B2
(45) Date of Patent: Jun. 28, 2022

(54) ILLUMINATION DEVICE AND ILLUMINATION SYSTEM

(71) Applicant: OSRAM Opto Semiconductors GmbH, Regensburg (DE)

(72) Inventors: Horst Varga, Lappersdorf (DE); Elmar Baur, Regensburg (DE); Alexander Wilm, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/498,316

(22) PCT Filed: Mar. 20, 2018

(86) PCT No.: PCT/EP2018/057024
§ 371 (c)(1),
(2) Date: Sep. 26, 2019

(87) PCT Pub. No.: WO2018/177813
PCT Pub. Date: Oct. 4, 2018

(65) Prior Publication Data
US 2020/0214105 A1    Jul. 2, 2020

(30) Foreign Application Priority Data

Mar. 31, 2017  (DE) .......................... 102017106959.3

(51) Int. Cl.
*H01L 25/075* (2006.01)
*F21S 4/28* (2016.01)
(Continued)

(52) U.S. Cl.
CPC ............ *H01L 25/0753* (2013.01); *F21S 4/28* (2016.01); *H05B 45/345* (2020.01);
(Continued)

(58) Field of Classification Search
None
See application file for complete search history.

(56) References Cited

U.S. PATENT DOCUMENTS 8,052,303 B2 * 11/2011 Lo .......................... H05B 45/30
362/249.05
8,066,402 B2 * 11/2011 Klipstein .................. F21L 4/08
362/208
(Continued)

FOREIGN PATENT DOCUMENTS

CN          201267029 Y        7/2009
CN          102076151 A        5/2011
(Continued)

OTHER PUBLICATIONS

"LT3092 200mA 2-Terminal Programmable Current Source," Linear Technology, Data Sheet, downloaded from http://cds.linear.com/docs/en/datasheet/3092fb.pdf, Dec. 2009, 24 pages.
(Continued)

*Primary Examiner* — Srinivas Sathiraju
(74) *Attorney, Agent, or Firm* — Slater Matsil, LLP

(57) ABSTRACT

A lighting device and a lighting system are disclosed. In an embodiment, a lighting device includes at least one optoelectronic semiconductor chip, two contacts configured to couple the lighting device to a DC voltage and a driver circuit interconnected in series with the at least one semiconductor chip in a string, wherein the driver circuit comprises a monolithic, unhoused controller, wherein the driver circuit is configured to adjust a current for operating the at least one semiconductor chip, and wherein the string extends between the two contacts in an electrically coupling way.

18 Claims, 4 Drawing Sheets

(51) Int. Cl.
H05B 45/345    (2020.01)
H05B 45/48     (2020.01)
H05B 45/375    (2020.01)
H05B 45/395    (2020.01)
F21Y 105/18    (2016.01)
F21Y 115/10    (2016.01)

(52) U.S. Cl.
CPC ......... *H05B 45/375* (2020.01); *H05B 45/395* (2020.01); *H05B 45/48* (2020.01); *F21Y 2105/18* (2016.08); *F21Y 2115/10* (2016.08)

(56) References Cited

U.S. PATENT DOCUMENTS

| | | | | |
|---|---|---|---|---|
| 8,421,329 | B2* | 4/2013 | Liang | F21V 29/773 313/317 |
| 8,496,351 | B2* | 7/2013 | Lo | H05B 45/30 362/249.05 |
| 8,957,597 | B2* | 2/2015 | Lin | G02B 6/0076 315/308 |
| 9,246,403 | B2* | 1/2016 | Siessegger | H01L 33/62 |
| 10,185,076 | B2* | 1/2019 | Woodgate | H01L 24/48 |
| 10,260,683 | B2* | 4/2019 | Bergmann | H05B 45/3577 |
| 10,326,062 | B2* | 6/2019 | Chiu | H01L 33/54 |
| 10,422,484 | B2* | 9/2019 | Allen | F21K 9/64 |
| 11,073,248 | B2* | 7/2021 | Jiang | F21K 9/61 |
| 2003/0058650 | A1* | 3/2003 | Shih | H05K 1/021 362/800 |
| 2005/0162101 | A1* | 7/2005 | Leong | H05B 45/10 315/200 A |
| 2005/0281030 | A1* | 12/2005 | Leong | H05B 47/11 362/234 |
| 2007/0228999 | A1* | 10/2007 | Kit | H05B 45/37 315/291 |
| 2008/0068298 | A1* | 3/2008 | Shen | G09G 3/14 345/46 |
| 2008/0290814 | A1* | 11/2008 | Leong | F21K 9/27 315/294 |
| 2010/0176733 | A1* | 7/2010 | King | H05B 47/175 315/210 |
| 2010/0291993 | A1* | 11/2010 | Gagner | 463/36 |
| 2011/0273076 | A1* | 11/2011 | Liang | H05K 1/0295 257/E33.012 |
| 2011/0285289 | A1* | 11/2011 | Tremblay | F21V 23/005 315/35 |
| 2011/0297970 | A1* | 12/2011 | Lo | H05B 45/30 257/E33.066 |
| 2012/0081005 | A1* | 4/2012 | Lin | G02B 6/0076 315/86 |
| 2013/0002159 | A1* | 1/2013 | Chen | H05B 45/375 315/200 R |
| 2013/0063035 | A1* | 3/2013 | Baddela | H05B 45/3577 315/192 |
| 2013/0099272 | A1* | 4/2013 | von Malm | H01L 33/385 438/22 |
| 2013/0207548 | A1* | 8/2013 | Leshniak | H05B 45/44 315/297 |
| 2014/0009085 | A1* | 1/2014 | Veskovic | H02M 3/33546 315/307 |
| 2014/0132163 | A1* | 5/2014 | Baumann | H05B 45/40 315/185 R |
| 2014/0367710 | A1* | 12/2014 | Akiyama | H01L 25/167 257/88 |
| 2015/0061497 | A1* | 3/2015 | Martins | F21V 23/04 315/291 |
| 2015/0294959 | A1* | 10/2015 | Lee | H01L 33/486 257/89 |
| 2015/0311249 | A1* | 10/2015 | Weng | H01L 25/0753 257/88 |
| 2016/0138768 | A1* | 5/2016 | Greene | H05B 1/00 29/842 |
| 2016/0227616 | A1* | 8/2016 | Lee | H05B 45/37 |
| 2016/0293802 | A1* | 10/2016 | Lin | H01L 33/60 |
| 2016/0323968 | A1* | 11/2016 | Yue | H01L 33/54 |
| 2016/0380171 | A1* | 12/2016 | Lin | H01L 33/486 257/98 |
| 2017/0025588 | A1* | 1/2017 | Weng | H01L 33/54 |
| 2018/0145205 | A1* | 5/2018 | Chen | A61B 5/14552 |
| 2018/0315907 | A1* | 11/2018 | Chiu | H01L 33/54 |
| 2018/0328543 | A1* | 11/2018 | Bergmann | H01L 33/62 |
| 2019/0088842 | A1* | 3/2019 | Lin | H01L 33/505 |
| 2020/0284883 | A1* | 9/2020 | Ferreira | G01S 17/894 |

FOREIGN PATENT DOCUMENTS

| | | |
|---|---|---|
| CN | 103843458 A | 6/2014 |
| CN | 203910842 U | 10/2014 |
| DE | 2616274 A1 | 10/1977 |
| DE | 102007003343 A1 | 3/2008 |
| DE | 202010007980 U1 | 10/2010 |
| DE | 102011078620 A1 | 1/2013 |
| DE | 202013008967 U1 | 2/2014 |
| DE | 102014205470 A1 | 9/2015 |
| EP | 2797128 A1 | 10/2014 |
| EP | 3229269 A1 | 10/2017 |

OTHER PUBLICATIONS

Infineon, "LED Driver BCR 420U E6327/BCR 421U E6327," Datasheet, Power Management & Multimarket, Jan. 28, 2015, 27 pages.

Infineon, "LED Driver," BCR 420U E6327 / BCR 421U E6327, Datasheet, Revision 2.1, Power Management & Multimarket, Jan. 28, 2015, 26 pages.

* cited by examiner

ILLUMINATION DEVICE AND ILLUMINATION SYSTEM

This patent application is a national phase filing under section 371 of PCT/EP2018/057024, filed Mar. 20, 2018, which claims the priority of German patent application 102017106959.3, filed Mar. 31, 2017, each of which is incorporated herein by reference in its entirety.

TECHNICAL FIELD

The invention relates to an optoelectronic lighting device for operating with a DC voltage and a corresponding lighting system.

BACKGROUND

Light sources for general lighting purposes, comprising light-emitting diodes (LEDs), are usually supplied with constant current by means of electronic ballasts. The ballast converts mains voltage, for example, AC voltage with 230V and 50-1z, into DC voltage and limits a constant current flowing through the LEDs. In particular in the case of so-called spotlight luminaires, such a ballast can be necessary for each luminaire, making such luminaires voluminous and expensive.

SUMMARY OF THE INVENTION

Embodiments provide a lighting device, which can be produced in a space-saving and cost-effective manner, as well as a corresponding lighting system.

According to a first aspect, a lighting device for operating with a DC voltage is specified. In particular, the lighting device can be a spotlight or a similar light source. The lighting device can optionally have a housing or, for example, only comprise an assembled circuit board.

In an advantageous embodiment according to the first aspect, the lighting device comprises at least one optoelectronic semiconductor chip. The at least one semiconductor chip can be a light emitting diode chip or a laser diode chip. The at least one semiconductor chip is electrically contacted via a carrier and/or additional bonding wires, for example.

In an advantageous embodiment according to the first aspect, the lighting device comprises two contacts for coupling the lighting device with the DC voltage. The contacts can be arranged exemplarily on the aforementioned carrier. If necessary, the contacts can be lead through of a housing of the lighting device for external contacting of the lighting device.

In an advantageous embodiment according to the first aspect, the lighting device comprises a driver circuit, which is interconnected in series with the at least one semiconductor chip in a string and is arranged to adjust a current for operating the at least one semiconductor chip. The driver circuit can be a current regulator or a current controller. In particular, the driver circuit is formed for coupling to a DC voltage source and is formed to limit and/or adjust a current in the string. The driver circuit is, for example, integrated into the lighting device in such a way that it is arranged with the at least one semiconductor chip on a common carrier and/or enclosed by a common housing together with the carrier and the at least one semiconductor chip.

In an advantageous embodiment according to the first aspect, the string extends between the two contacts in an electrically coupling way. In other words, the first contact is electrically coupled to one end of the string and the second contact is electrically coupled to the other end of the string.

In an advantageous embodiment according to the first aspect, a lighting device for operating with a DC voltage is specified, comprising at least one optoelectronic semiconductor chip, two contacts and a driver circuit. The contacts are formed to couple the lighting device with the DC voltage. The driver circuit is interconnected in series with at least one semiconductor chip in a string. In addition, the driver circuit to adjust a current is formed to operate at least one semiconductor chip. The string extends between the two contacts in an electrically coupling way.

Because the lighting device comprises the driver circuit, the lighting device can be coupled to a DC voltage source for operation, so that an external ballast can be dispensed with. Advantageously, in addition to the costs of electrical components of the ballast, costs due to the size of such ballasts and space required for a housing of the ballast are dispensed with. In particular, several such lighting devices can be operated with the same DC voltage source.

In an advantageous embodiment according to the first aspect, the lighting device comprises a carrier. The carrier can be a printed circuit board or a ceramic substrate. In particular, the carrier can also serve as a heat sink. As an example, the carrier comprises or consists of a metal or a metal alloy.

In an advantageous embodiment according to the first aspect, the lighting device comprises a carrier on which the at least one semiconductor chip is arranged. Optionally, at least one semiconductor chip can also be specifically thermally coupled to the carrier. As an example, the at least one semiconductor chip is attached to the carrier for this purpose by means of a thermally conductive adhesive and/or a thermally conductive substrate.

In an advantageous embodiment according to the first aspect, the driver circuit and the at least one semiconductor chip are arranged on a common carrier. Advantageously, this enables a simple contacting and interconnection of the driver circuit with the electrical components of the lighting device. In addition, the driver circuit can thus be thermally coupled to the carrier as a heat sink.

In an advantageous embodiment according to the first aspect, the at least one semiconductor chip is unhoused. An unhoused optoelectronic semiconductor chip is a so-called "bare die" or "bare chip". This is to say that an unhoused optoelectronic semiconductor chip comprises only the bare semiconductor chip and is not installed in a housing, for example, in a plastic or ceramic housing. An unhoused optoelectronic semiconductor chip is therefore free of a housing. Compared to housed semiconductor chips, a high density of semiconductor chips on the carrier can thus be achieved advantageously. Heat generated during operation of the semiconductor chips can be efficiently dissipated via the carrier.

In an advantageous embodiment according to the first aspect, the lighting device comprises a plurality of optoelectronic semiconductor chips, wherein the carrier with the semiconductor chips forms a chip-on-board(COB)module. "COB" stands here for "bare chip assembly", so the semiconductor chips are formed unhoused in this context.

In particular, the COB module can comprise a large number of individually, in series and/or in parallel interconnected semiconductor chip strings. In this context, one or more driver circuits can be provided for current control per interconnection or per string. If, for example, one driver circuit per string is interconnected in series with one or more optoelectronic semiconductor chips, a measurement and sorting of the semiconductor chips prior to their assembly in this string can be dispensed with as far as possible. In particular, in the case of several of such strings, an advantageous distribution of the heat-generating driver circuits on the carrier during operation is also achieved. If, on the other hand, several strings are interconnected in parallel, wherein one driver circuit is provided per interconnection, for example, only one driver circuit for all optoelectronic semiconductor chips, complexity in the electrical contacting and interconnection of the individual components can be kept low and costs for further driver circuits can be saved.

In an advantageous embodiment according to the first aspect, the lighting device is formed for operating with a DC voltage between 5V and 100V, in particular 12V, 24V or preferably 48V. Advantageously, operating with such a DC voltage enables a so-called "hot-swapping" or "hot-plugging" of the lighting device, i.e., a replacement of the lighting device during operation.

In an advantageous embodiment according to the first aspect, the driver circuit comprises a monolithic controller.

The controller can be a longitudinal controller. For example, a linear controller or a buck converter is conceivable. The controller is preferably thermally connected to the carrier in order to ensure reliable heat dissipation. For example, the controller includes an NPN transistor and a Zener diode interconnected between a base and emitter to provide a reference voltage. As an alternative to the Zener diode, the controller can also have several PN transitions interconnected in series.

In an advantageous embodiment according to the first aspect, the controller is formed unhoused. Advantageously, the space requirement of the controller is kept low.

In an advantageous embodiment according to the first aspect, the driver circuit comprises, external to the controller, a resistor to adjust the current for operating the at least one semiconductor chip. The resistor can in particular be a shunt, which is coupled to a transistor of the controller as an emitter resistor for current stabilization.

In an advantageous embodiment according to the first aspect, the resistor is light-sensitive in such a way that its resistance value changes as a function of a luminous flux, in particular to compensate for a change in the light output of the at least one semiconductor chip. For example, the change in the light output can be a degradation of the at least one semiconductor chip.

For example, the resistor in this context comprises a conventional electrical resistor and a light-sensitive element, such as a photo resistor, a photo transistor or a light-sensitive sensor. The light-sensitive element is exposed to radiation generated during operation of the lighting device and, in particular, is formed to regulate a falling luminous flux by increasing the operation current of the at least one semiconductor chip in such a way that a constant luminous flux of the lighting device is achieved. Advantageously, this allows the compensation of a reduction of the light output during the operation of the lighting device (degradation). In particular, this allows the luminous flux of the luminaire to be kept constant over its life time, so that no redundant light output needs to be maintained when installing luminaires, even with regard to legal requirements. Advantageously, this contributes to saving energy and costs.

In an advantageous embodiment according to the first aspect, the lighting device comprises a converter circuit with a supply output. The converter circuit is electrically coupled to the two contacts and formed to provide a supply voltage via the supply output.

The supply voltage is, for example, between 0.1V and boy, in particular 3.3V or 5V.

Advantageously, this allows a power supply of additional components besides the at least one optoelectronic semiconductor chip, and/or an internal power supply of the at least one optoelectronic semiconductor chip. In particular, this makes it possible to dispense with additional components for the power supply, which would have to be installed in a lighting device with a ballast in the form of a housed circuit board with the lighting device. In other words, additional components in the lighting device can be supplied directly with the supply voltage without a separate ballast, thus helping to save costs and installation space.

The converter circuit can be arranged on the carrier analogously to the driver circuit and can be specifically thermally coupled to the carrier so that a safe operation of the converter circuit is guaranteed.

The converter circuit can, for example, be a linear controller or a buck converter. Alternatively, the converter circuit can be a mixture of linear controller and buck converter to allow a compromise between efficiency, complexity and flexibility. For example, in this context the converter circuit includes a high-impedance input resistor to minimize losses, and a capacitor interconnected in parallel to a Zener diode and charged to provide the supply voltage for a predetermined duration. In addition, the converter circuit can include a power section of a buck converter, which only needs to be switched at a given frequency and duty cycle.

In an advantageous embodiment according to the first aspect, the lighting device also includes a control unit. To operate the control unit, the converter circuit is electrically coupled to the control unit via the supply output.

For example, the control unit can be a micro controller. As an example, the micro controller is formed for a controlling and/or dimming of the at least one optoelectronic semiconductor chip. The control unit is formed in particular for an operation with the supply voltage. As an alternative or in addition to the control unit, the lighting device can include further components, such as a communication interface such as a radio receiver for Bluetooth, Wifi or ZigBee, sensors such as thermometers, motion detectors, spectrometers, ambient light sensors, microphones or cameras, or Internet-of-Things components.

In an advantageous embodiment according to the first aspect, the controller has a control input. In addition, the control unit is signal-coupled with the control input and formed to control a radiation-emitting operation of the at least one semiconductor chip. In particular, it is conceivable to switch the radiation-emitting operation of the lighting device on or off, or to implement a dimming.

In an advantageous embodiment according to the first aspect, the converter circuit has an excitation input. In addition, the control unit can be signal-coupled with the excitation input and set up to provide an excitation signal to excite a switching frequency of the converter circuit. Advantageously, this enables efficient and safe operation of the converter circuit.

In an advantageous embodiment according to the first aspect, the driver circuit is formed for operating with a predetermined operating voltage and is arranged between a first portion of the string and a second portion of the string. In addition, a number of optoelectronic semiconductor chips arranged in the second portion of the string are selected depending on the DC voltage for operating the lighting device, the predetermined operating voltage of the driver circuit, and a predetermined operating voltage of the semiconductor chips in the second portion.

Advantageously, this enables the use of a driver circuit, in particular a controller, which is formed for operating with a lower operating voltage than the DC voltage required for operating of the lighting device. By the number of optoelectronic semiconductor chips arranged in the second portion of the string makes it possible to reduce the DC voltage applied to the two contacts, required for the operation of the lighting device, to an operating voltage suitable for operating the driver circuit according to the voltage division principle.

According to a second aspect, a lighting system is specified. The lighting system comprises at least one lighting device according to the first aspect and a DC voltage source being electrically coupled to the two contacts of the at least one lighting device and formed to provide the DC voltage for operating the lighting device.

The DC voltage source can be a DC voltage source. In particular, this can be a power supply unit formed for operating with mains voltage.

Instead of providing a separate ballast for each lighting device, it is advantageous to use a common DC voltage source in combination with the much smaller and cheaper driver circuits. Since the aforementioned ballasts are typically specially developed for the lighting market, they are also more expensive than DC voltage sources developed for a wider range of applications.

For example, the lighting system can include three, four or more lighting devices.

In an advantageous embodiment according to the second aspect, the lighting system comprises five, six or more lighting devices.

BRIEF DESCRIPTION OF THE DRAWINGS

Exemplary embodiments of the invention are explained in more detail below using schematic drawings.

They show.

Elements of the same construction or function are provided with the same reference signs for all figures.

DETAILED DESCRIPTION OF ILLUSTRATIVE EMBODIMENTS

Figure 1:
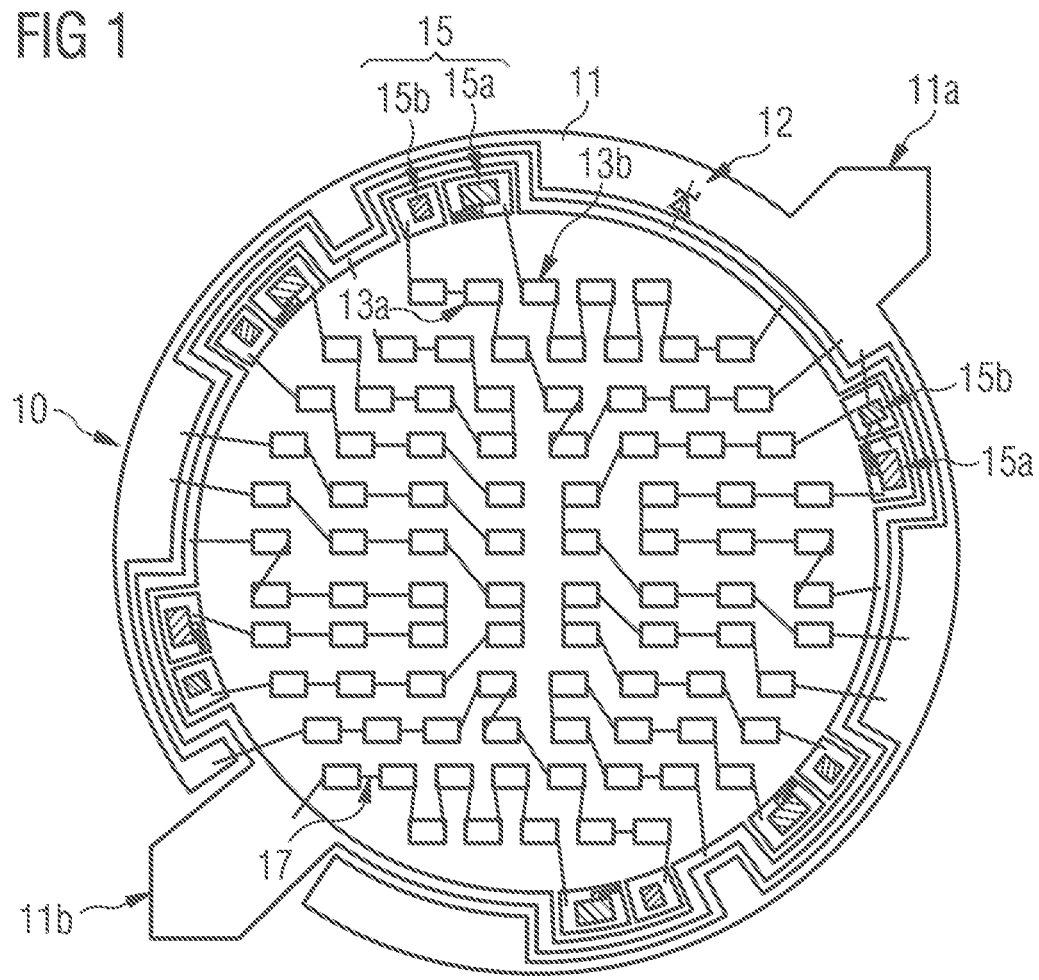
FIG. 1 shows a first exemplary embodiment of a lighting device.

FIG. 1 shows a first exemplary embodiment of a lighting device 10. The lighting device 10 is an example of a COB-module with a carrier 11 on which a plurality of unhoused optoelectronic semiconductor chips 13a, 13b, in particular LEDs are arranged. The semiconductor chips can, for example, be surrounded by a protective and/or wavelength-converting potting compound and form a luminous surface 13 with this (see, for example, FIG. 5).

The carrier 11 comprises two contacts 11a, 11b for coupling the lighting device 10 with a predetermined operating voltage. In the present exemplary embodiment, the lighting device 10 is formed for operating with 48V DC voltage as the operating voltage, which is exemplarily applied to the first contact 11a, while the second contact 11b is coupled to ground.

Between the two contacts 11a, 11b six strings 17 are arranged (see, for example, FIG. 2), each of which is coupled at one end to the first contact 11a and at its other end to the second contact 11b. The strings 17 each comprise fifteen optoelectronic semiconductor chips 13a, 13b interconnected in series as well as in each case a driver circuit 15, which is arranged at one edge of carrier 11. Each driver circuit 15 consists of a monolithic linear controller 15a, as well as a resistor 15b, through which a current in the string 17 can be adjusted, and a radiation emitting operation of the semiconductor chips 13a, 13b can be enabled. Optionally, the lighting device 10 can also include a Zener diode 12, which is arranged between the two contacts 11a, 11b.

Since the lighting device 10 comprises the driver circuit 15, the lighting device 10 can be operated with DC voltage and a more voluminous ballast for operating with mains voltage can be dispensed with.

Figure 2:
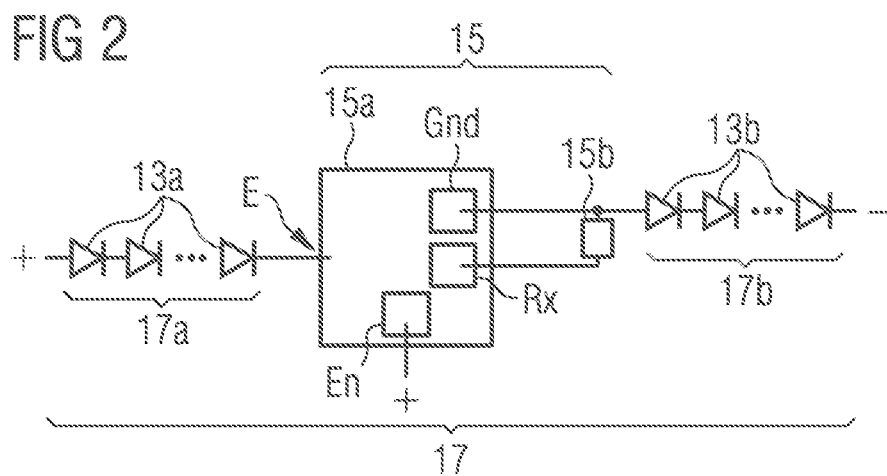
FIG. 2 shows an exemplary string of the lighting device according to FIG. 1.
Figure 3:
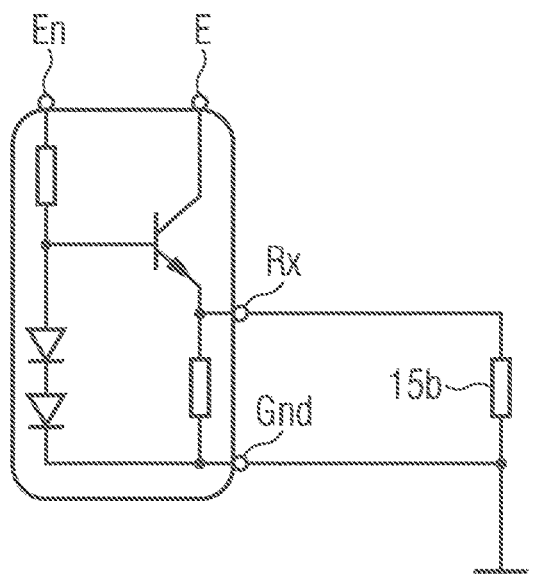
FIG. 3 shows an exemplary driver circuit for the lighting device according to FIG. 1.

The compact linear controller 15a comprises, for example, an NPN transistor and a Zener diode (or several PN transitions interconnected in series) to provide a reference voltage. Via the resistor 15b, which is connected to the emitter side of with regard to the transistor and serves as a shunt, the current in the respective string 17 is stabilized. If the current in string 17 rises, e.g., when the voltage applied to the contacts 11a, 11b is increased, this affects a voltage drop at the shunt, whereby the base-emitter voltage at the transistor decreases, the base current is reduced and the transistor becomes more high-impedance so that the current in the string 17 is throttled or kept constant, respectively, since the difference between the reference voltage, the voltage dropped at the shunt and the base-emitter voltage is equal to zero. The reference voltage can be provided from the voltage at an optional control input En in order to extend the control capabilities of the lighting device 10 as shown in FIG. 2 below.

In a first exemplary embodiment, the resistor 15b of the driver circuit 15 is a constant SMD resistor, so that the current in the respective string 17 is throttled to a predetermined value.

In the course of their operation, the emitted light output of the semiconductor chips 13a, 13b is reduced due to various degradation effects, for example, such as browning of housing materials and casting compounds, which limits the life time of the semiconductor chips 13a, 13b. For example, in 50% of the semiconductor chips 13a, 13b, the light output dropped to 70% after 25,000 operating hours. For example, in order to achieve a legally required 500 lx in an office with a 3000 lm lighting installation, a 3300 lm lighting installation can be used to meet the legal requirements even after 25,000 operating hours. Over a long period of time, however, more energy is consumed than necessary as a result of this storage.

In a second exemplary embodiment, the resistor 15b is formed therefore light-sensitively. Resistor 15b is arranged so that it is irradiated by light from the semiconductor chips 13a, 13b. In addition, the resistor is formed in such a way that it causes an increase in the current in string 17 when the luminous flux drops so that the resulting luminous flux remains constant. In this way, it can contributed to compensate for degradation.

FIG. 2 shows an exemplary string 17 of the lighting device 10 according to the first exemplary embodiment in schematic detail view.

The string 17 comprises a first portion 17a extending between the first contact 11a (shown as '+' in the Figure) and the driver circuit 15, and a second portion 17b, extending between the driver circuit 15 and the second contact 11b (shown as '−' in the Figure).

In the first portion 17a, several semiconductor chips 13a, in the present exemplary embodiment eight, are arranged and connected to a backside contact E of the monolithic linear controller 15a.

Figure 4:
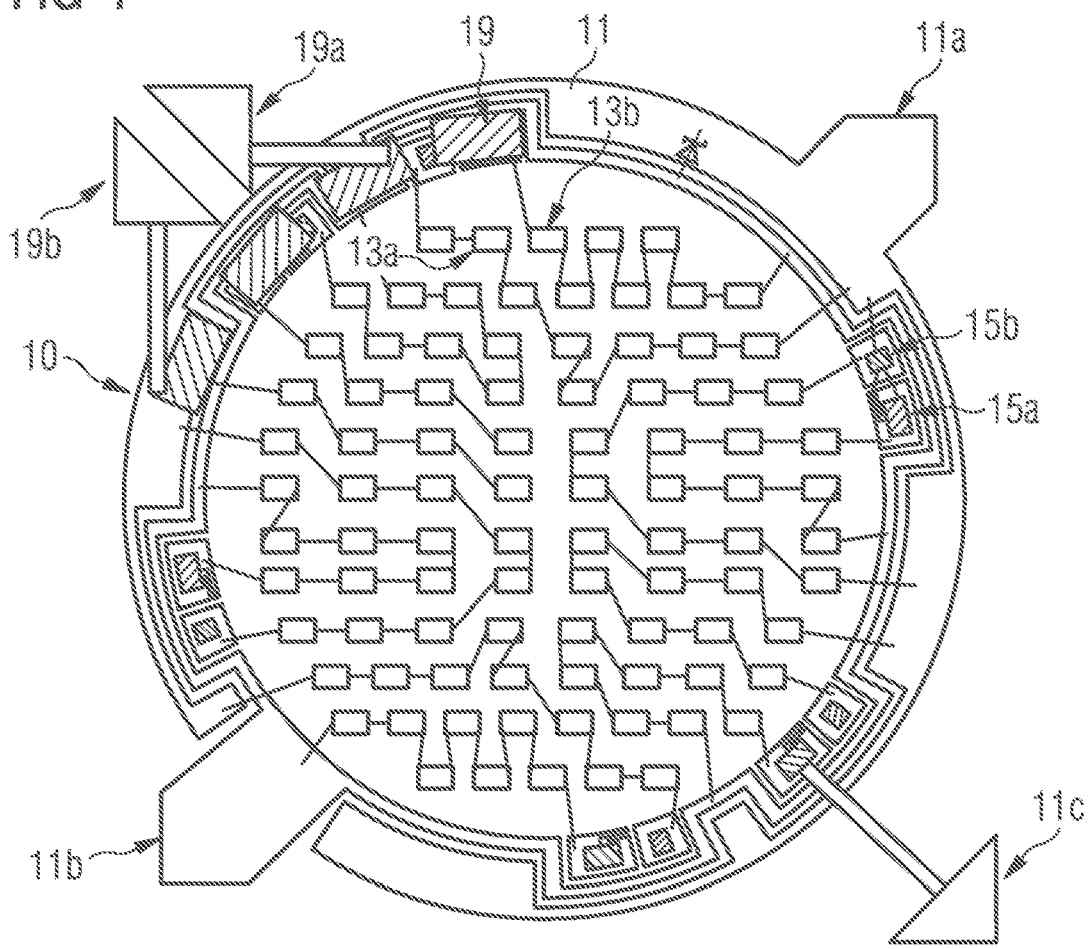
FIG. 4 shows a second exemplary embodiment of a lighting device.

The controller 15a, for example, a controller of type BCR 421 U from the company Infineon, has a ground connection Gnd and a reference voltage connection Rx, between which the resistor 15b is connected. An exemplary circuit diagram of the driver circuit 15 is shown in FIG. 4. In addition, the ground connection Gnd is connected to the second portion 17b, in which further semiconductor chips 13b, in the present exemplary embodiment seven, are arranged.

The number of semiconductor chips 13b in the second portion 17b, is such that the voltage applied to the linear controller 15a corresponds only to a part of the voltage applied to the contacts 11a, 11b, which is less than or equal to a nominal operating voltage of the linear controller 15a. Even with high operating voltages of the lighting device 10, low-power or low-cost linear controllers 15a can be used in an advantageous manner.

The linear controller 15a shown in FIG. 2 also has an optional control input En, which is coupled to the first contact 11a in the present exemplary embodiment.

A voltage applied to the control input En can be used to control an operation of the driver circuit 15 and thus a radiation-emitting operation of the semiconductor chips 13a, 13b. In particular, dimming as well as switching on and off the semiconductor chips 13a, 13b can be realized, even if the operating voltage is still applied at the contacts 11a, 11b. In order to realize such a control, the control input En can therefore alternatively be coupled to a control unit 20 such as a micro controller (see FIG. 5). In order to control several strings 17 or several lighting devices 10 simultaneously by means of a single control unit 20, the respective control inputs En can be connected in parallel as an example.

Figure 5:
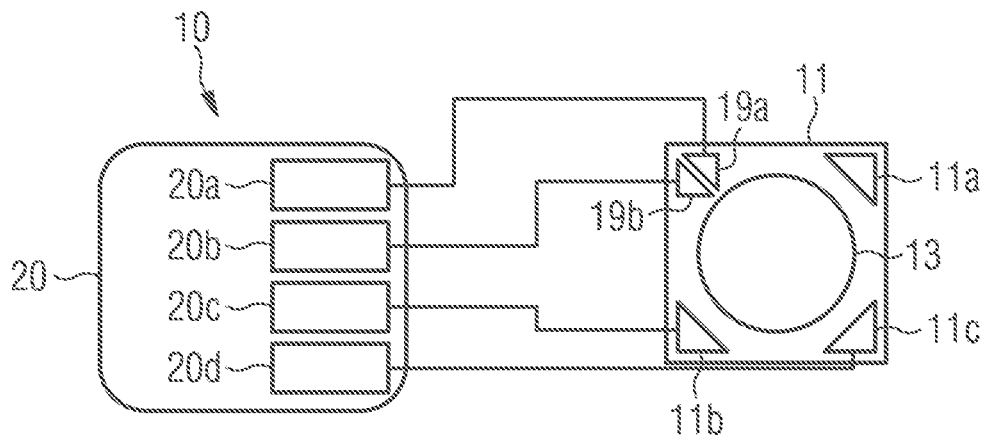
FIG. 5 shows a third exemplary embodiment of a lighting device.

The following second exemplary embodiment, described in FIGS. 4 and 5, discusses how such a control unit 20 can be integrated into the lighting device 10.

The second exemplary embodiment differs from the first exemplary embodiment in a way that the control input En of the linear controllers 15a is coupled to an additional, third contact 11c instead of to the first contact 11a, which is led to an edge of the carrier 11 in the same way as the two contacts 11a and 11b.

In addition, in the second exemplary embodiment, the lighting device 10 comprises a converter circuit 19, which is schematically shown as four hatched boxes. The converter circuit 19 is coupled to the contacts 11a, 11b and in turn has additional contacts 19a, 19b, which are led to an edge of the carrier 11. The good thermal connection of the semiconductor chips 13a, 13b can be advantageously used to dissipate heat generated during operation of the converter circuit 19 by integrating the converter circuit 19 in the lighting device 10 and arrangement on the carrier 11.

The converter circuit 19 is formed to convert the operating voltage of the lighting device 10, i.e., 48V DC voltage, into a lower voltage typical for additional components, e.g., 3.3V or 5V. For this purpose, a linear controller or a buck converter can be used as an example of a converter circuit 19. A preferred embodiment of the converter circuit 19 is described below in FIG. 6.

The lower voltage can be tapped as a supply voltage from an additional component of the lighting device 10 or from an external device at the contact 19a, which serves as the supply output of the converter circuit 19. Advantageously, the integration of the converter circuit 19 in the lighting device 10 makes it possible to dispense with external components for providing a supply voltage, which would otherwise have to be installed in the form of a housed circuit board. In particular, an additional ballast can also be dispensed with in this context.

As shown in FIG. 5, the lighting device 10 can include a control unit 20, which is coupled to a supply input 20a with the supply output 19a of the converter circuit 19. In addition, a ground connection 20C of the control unit 20 is coupled to the second contact 11b of the lighting device 10. A control output god of the control unit 20 is coupled to the third contact 11c of the lighting device 10, which serves as control input En of the linear controller 15a (see, for example, FIG. 2). Advantageously, this enables extensive control of the radiation-emitting operation of the lighting device 10 even with the operating voltage applied to contacts 11a and 11b.

Optionally, the control unit 20 can also have an excitation output 20b, which is coupled to contact 19b of the converter circuit. Via the excitation output, for example, an excitation signal V2 can be provided to excite a switching frequency of the converter circuit 19, for example, a pulsed square wave signal.

Figure 6:
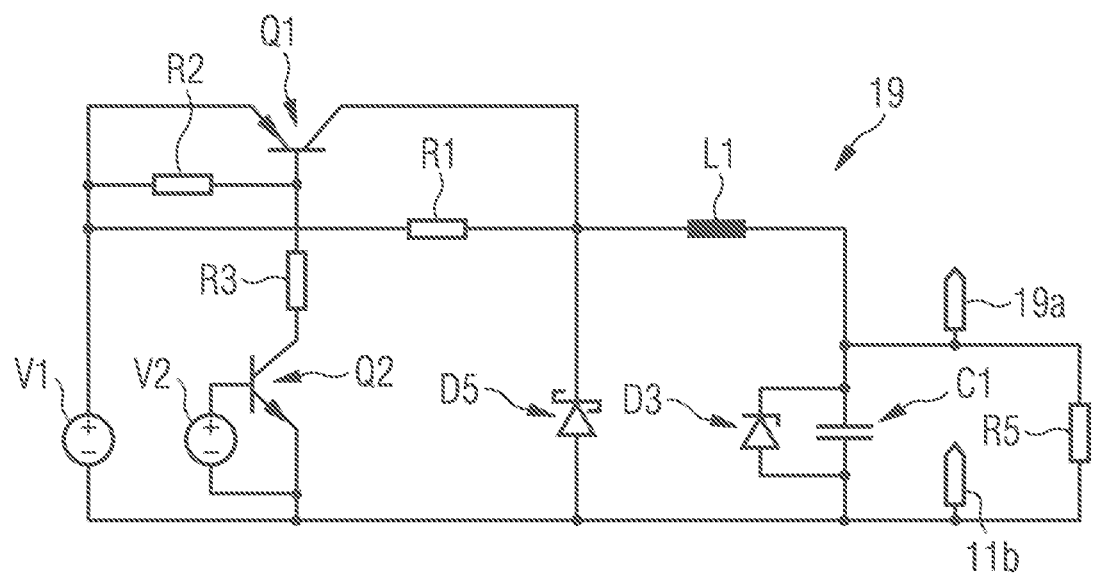
FIG. 6 shows an exemplary converter circuit of the lighting device according to FIG. 5.

In the following, a preferred embodiment of the converter circuit 19 for generating a 3.3V voltage from the 48V operating voltage applied to the contacts 11a, 11b of the lighting device 10, which is shown as voltage V1 in the circuit diagram, is described on the basis of the circuit diagram in FIG. 6. Instead of a linear controller, through which significant losses can be generated, or a complete buck converter, which would contribute to the complexity and cost of the converter circuit 19 with the number of required components, a converter circuit 19 as shown in FIG. 6 is proposed, which comprises a start circuit, which comprises a high-impedance resistor R2, for example, the height 100 kΩ, for minimizing losses as well as a precharge capacitor C1, which is connected in parallel to a 3.3V Zener diode D3. The capacitance of the capacitor C1 is chosen so high that an auxiliary circuit comprising, for example, the control unit 20, can be operated for a predetermined minimum duration, for example, 10 μF.

For example, an excitation signal V2 can be provided by the control unit 20 to excite a switching frequency of the converter circuit 19, which allows the voltage at the supply output 19a to be regulated to 3.3V with the transistor Q2, the coil L1 and the freewheeling Schottky diode D5. Furthermore, further resistors R1, R3, R5 and a transistor Q1 are included in the circuit.

Figure 7A:
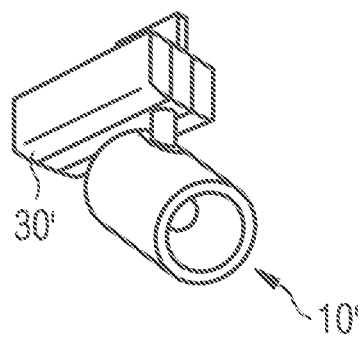
FIGS. 7a to 7b show exemplary first lighting systems.
Figure 7B:
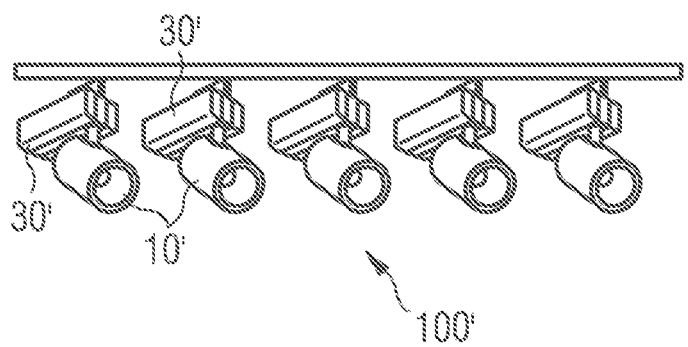

FIG. 7a shows an example of a lighting device 10' with an external ballast 30'. A first lighting system 100' (FIG. 7b), comprising several such lighting devices 10', requires an external ballast 30' per lighting device 10'.

Figure 8A:
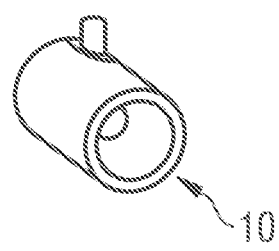
FIGS. 8a to 8b show exemplary second lighting systems with lighting devices according to FIGS. 1-5.
Figure 8B:
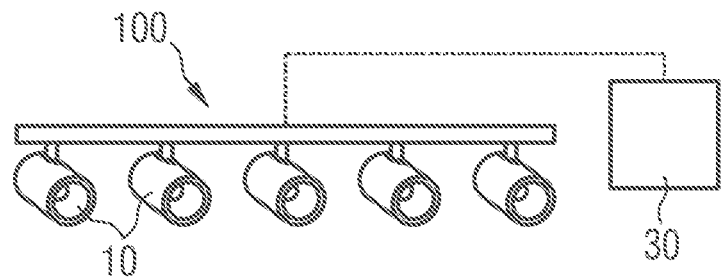

FIG. 8a shows an exemplary lighting device 10 with an internal driver circuit 15 (see, for example, FIGS. 1-5). A second lighting system 100 (FIG. 8b), comprising several such lighting devices 10, requires a common DC voltage source 30 and an internal driver circuit 15 for each lighting device 10. Currently, the relative light output per cost of the DC operated lighting devices 10 exceeds that of the lighting devices 10' with ballast 30' from about 3 to 5 lighting devices 10, 10', depending on the components used.

The invention is not limited by the description based on the exemplary embodiments of these. Rather, the invention includes any new feature and any combination of features, which in particular includes any combination of features in the claims, even if that feature or combination itself is not explicitly mentioned in the claims or exemplary embodiments.

The invention claimed is:

1. A lighting device comprising:
at least one optoelectronic semiconductor chip;
two contacts configured to couple the lighting device to a DC voltage;
a driver circuit interconnected in series with the at least one optoelectronic semiconductor chip in a string;
a converter circuit with a supply output;
a microcontroller being a control unit,
wherein the driver circuit comprises a monolithic, unhoused controller,
wherein the driver circuit is configured to adjust a current for operating the at least one optoelectronic semiconductor chip,
wherein the string extends between the two contacts in an electrically coupling way, and
wherein the converter circuit is a buck converter, is electrically coupled to the two contacts, is configured to provide a supply voltage via the supply output and is electrically coupled to the control unit via the supply output; and
a carrier which is a ceramic substrate,
wherein the driver circuit and the at least one optoelectronic semiconductor chip are arranged on the carrier,
wherein the carrier is a heat sink, and
wherein the at least one optoelectronic semiconductor chip is thermally coupled to the carrier.

2. The lighting device according to claim 1, wherein the at least one optoelectronic semiconductor chip is an at least one unhoused optoelectronic semiconductor chip.

3. The lighting device according to claim 2, further comprising
a plurality of optoelectronic semiconductor chips,
wherein the carrier with the optoelectronic semiconductor chips forms a chip-on-board (COB)-module.

4. The lighting device according to claim 1, wherein the driver circuit comprises, externally to the controller, a resistor, and wherein the resistor is configured to adjust the current for operating the at least one optoelectronic semiconductor chip.

5. The lighting device according to claim 4, wherein the controller has a ground connection and a reference voltage connection, between which the resistor is connected.

6. The lighting device according to claim 4, wherein the resistor is formed light-sensitively such that its resistance value changes as a function of a luminous flux.

7. The lighting device according to claim 1,
wherein the controller has a control input,
wherein the control unit is signal-technically coupled to the control input, and
wherein the control unit is configured to control a radiation-emitting operating of the at least one optoelectronic semiconductor chip.

8. The lighting device as claimed in claim 1,
wherein the converter circuit has an excitation input,
wherein the control unit is signal-technically coupled to the excitation input, and
wherein the control unit is configured to provide an excitation signal for exciting a switching frequency of the converter circuit.

9. The lighting device according to claim 1,
wherein the driver circuit is configured to operate with a predetermined operating voltage,
wherein the driver circuit is arranged between a first portion of the string and a second portion of the string, and
wherein a number of optoelectronic semiconductor chips arranged in the second portion of the string is selected depending on the DC voltage, the predetermined operating voltage of the driver circuit, and a predetermined operating voltage of the optoelectronic semiconductor chips in the second portion.

10. A lighting system comprising:
at least one lighting device according to claim 1; and
a DC voltage source electrically coupled to the two contacts of the at least one lighting device,
wherein the DC voltage source is configured to provide the DC voltage for operating the lighting device.

11. A lighting system comprising:
at least five lighting devices according to claim 1.

12. A lighting device comprising:
at least one optoelectronic semiconductor chip;
two contacts configured to couple the lighting device to a DC voltage; and
a driver circuit interconnected in series with the at least one optoelectronic semiconductor chip in a string,
wherein the driver circuit comprises a monolithic, unhoused controller,
wherein the driver circuit is configured to adjust a current for operating the at least one optoelectronic semiconductor chip,
wherein the string extends between the two contacts in an electrically coupling way,
wherein the driver circuit comprises, externally to the controller, a resistor, and wherein the resistor is configured to adjust the current for operating the at least one optoelectronic semiconductor chip, and
wherein the resistor is formed light-sensitively such that its resistance value changes as a function of a luminous flux.

13. The lighting device according to claim 12, wherein the driver circuit and the at least one optoelectronic semiconductor chip are arranged on a common carrier.

14. The lighting device according to claim 12, wherein the at least one optoelectronic semiconductor chip is an at least one unhoused optoelectronic semiconductor chip.

15. The lighting device according to claim 14, further comprising:
a carrier; and
a plurality of optoelectronic semiconductor chips,
wherein the carrier with the optoelectronic semiconductor chips forms a chip-on-board (COB)-module.

16. The lighting device according to claim 12,
wherein the driver circuit is configured to operate with a predetermined operating voltage,
wherein the driver circuit is arranged between a first portion of the string and a second portion of the string, and
wherein a number of optoelectronic semiconductor chips arranged in the second portion of the string is selected depending on the DC voltage, the predetermined operating voltage of the driver circuit, and a predetermined operating voltage of the optoelectronic semiconductor chips in the second portion.

17. A lighting system comprising:
at least one lighting device according to claim 12; and
a DC voltage source electrically coupled to the two contacts of the at least one lighting device,
wherein the DC voltage source is configured to provide the DC voltage for operating the lighting device.

18. A lighting device comprising:
at least one optoelectronic semiconductor chip;
two contacts configured to couple the lighting device to a DC voltage;
a driver circuit interconnected in series with the at least one optoelectronic semiconductor chip in a string;
a converter circuit with a supply output;
a microcontroller being a control unit,
wherein the driver circuit comprises a monolithic, unhoused controller,
wherein the driver circuit is configured to adjust a current for operating the at least one optoelectronic semiconductor chip,
wherein the string extends between the two contacts in an electrically coupling way,
wherein the converter circuit is a buck converter, is electrically coupled to the two contacts, is configured to provide a supply voltage via the supply output and is electrically coupled to the control unit via the supply output,
wherein the driver circuit comprises, externally to the controller, a resistor,
wherein the resistor is configured to adjust the current for operating the at least one optoelectronic semiconductor chip, and
wherein the resistor is a light-sensitive resistor configured to change its resistance value as a function of a luminous flux.

* * * * *